United States Patent [19]

Meek et al.

[11] 3,774,197

[45] Nov. 20, 1973

[54] CALCULATING MACHINES

[75] Inventors: Neil Meek; John David Letheren, both of Uxbridge, England

[73] Assignee: Sumlock Anita Electronics Limited, London, England

[22] Filed: July 9, 1971

[21] Appl. No.: 161,181

[30] Foreign Application Priority Data

July 15, 1970 Great Britain .................. 34,240/70

[52] U.S. Cl. .................... 340/347 DD, 340/347 DA

[51] Int. Cl. .............................................. H04l 3/00

[58] Field of Search .............. 340/347 DD, 347 DA, 340/365; 235/92, 155

[56] References Cited

UNITED STATES PATENTS

| | | | |
|---|---|---|---|
| 3,518,660 | 6/1970 | Nicklas | 340/347 DD |
| 3,350,708 | 10/1967 | Adler | 340/347 DD |
| 3,603,977 | 9/1971 | Szabo | 340/347 DA |
| 3,632,996 | 1/1972 | Paine | 340/347 DD |
| 3,581,116 | 5/1971 | Leostic | 340/347 DA |

*Primary Examiner*—Maynard R. Wilbur
*Assistant Examiner*—Jeremiah Glassman
*Attorney*—Laurence R. Brown

[57] ABSTRACT

A calculating machine is disclosed employing a circuit for repetitively generating a pulse train representing a depressed function or digit key. The generating circuit has a continuously driven closed-loop counter circuit, which has an output driving another closed-loop counter circuit to cyclically generate a 'reset' signal and a sequence of key code signals in which each code signal corresponds to code signal signalled from a matrix when a digit or function key is depressed. The code signals from the other counter circuit and the matrix are inputs to a group of coincidence circuits the outputs of which form a 'set' input to a two-state circuit which is set when two code signals coincide and which is reset by the reset signal from the other counter so that the length of the pulse output of the two-state circuit represents the signal of the key depressed.

A further signal is transmitted from the matrix circuit when a function key is depressed and this signal is gated with an output of the closed-loop counter circuit so that the two-state circuit output for a depressed function key occurs at a different time from that for a depressed digit key.

10 Claims, 4 Drawing Figures

Figure 1A:
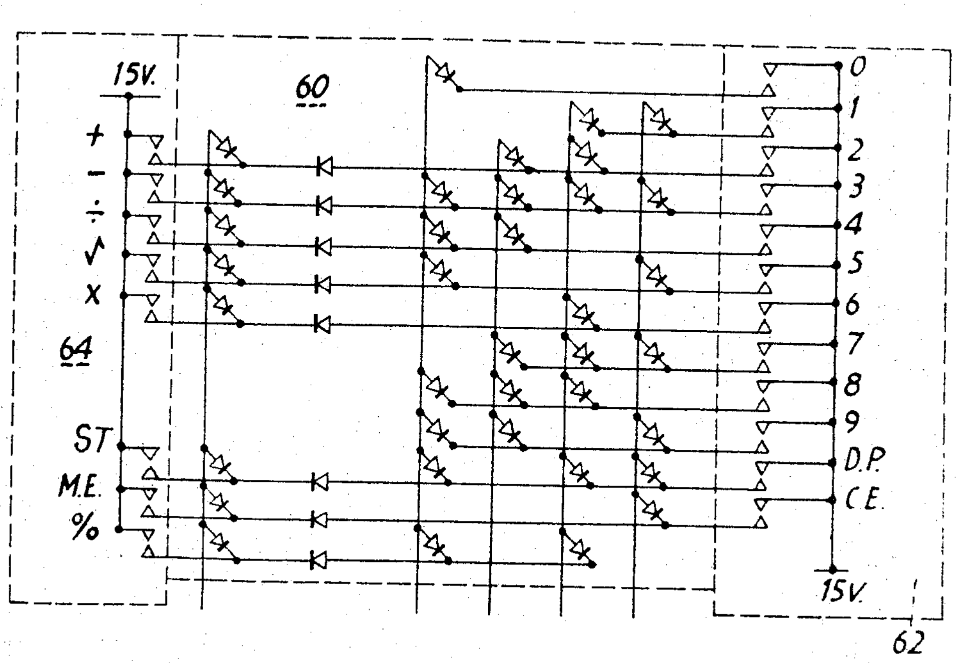

Inventors
Neil Meek
John David Letheren
By Laurence R. Brown
Attorney

CALCULATING MACHINES

This invention relates to a circuit for converting a coded signal signal appearing on at least one input line into an output pulse train which is proportional to the code of the coded signal; more particularly, but not solely to a converting circuit for use in an electronic calculating machine According to the present invention there is provdied a circuit for converting a signal code appearing on at least two circuit inputs into an output pulse train which is proportional to the signal code, the circuit including a circuit for generating in cyclic sequence a reset pulse and a succession of signals which correspond to the code signals which can appear on the circuit input, a circuit for comparing the code signal on the circuit input with the successive code signals generated by the generating circuit so as to emit a set pulse when the code signals coincide, a two-state circuit having an output operable by a set signal and by a reset signal so as to emit a pulse whose length is proportional to the code signal on the circuit input, and a gating circuit for converting the pulse from the two-state circuit into the equivalent output pulse train.

Preferably, the generating circuit includes a first closed-loop counter circuit having an input connected to/a source of count pulses and having a first output and a second output and a second closed-loop counter circuit having the input thereof connected to the first output of the first counter circuit and having at least two outputs to generate in cyclic sequence the reset pulse and the succession of code signals. Preferably, the reset pulse is generated from an AND gate circuit whose output is connected to the reset input of the two-state circuit and whose inputs are connected to outputs of the second counter circuit so that a reset pulse is generatd once during every cycle of count states of the second counter circuit.

Preferably, the comparing circuit includes at least two coincidence circuits each having two inputs, each coincidence circuit having one input connected to an input of the converting circuit respectively and having the other input connected to an output of the second counter circuit respectively, and an AND gate circuit having inputs connected to the outputs of the coincidence circuits respectively and having the output thereof connected to the set input of the two-state circuit and having an input of the AND gate circuit connected to the second output of the first counter circuit; whereby, when a signal code appears on the inputs of the converting circuit and when the source of pulses supplies pulses to pulse in sequence the first and second outputs of the first counter circuit, the successive pulses on the first output supply pulses to the second counter circuit to pulse the outputs thereof in successive cyclic sequence so as to transmit along the respective other inputs to the coincidence circuits the sequence of successive code signals with the successive pulses on the second output of the first counter circuit supplying pulses to the AND gate circuit between successive code signals of the sequence of code signals; and whereby, when the coded signal appears in coincidence on the respective one and other inputs of the coincidence circuits, the output of the two-state circuit is changed by a set pulse from the AND gate circuit and the two-state circuit is changed by a reset pulse from the AND gate circuit so as to generate a pulse whose length is proportional to the code of the code signal.

Preferably the circuit includes a function decoder line which is energised when a function signal is signalled, an invertor circuit connected to the function line, a pair of two-input gate other having one input on each gate circuit connected to the function line and invertor output respectively and having the oher inputs connectd to the output of the two-state circuit, a pair of switching means whose inputs are connected to the outputs of the pair of gate circuits respectively and whose outputs are connected to a common output line, and control connections of the switch means are connected to the third and fourth outputs respectively of the first counter circuit, which third and fourth outputs are energised after the first output but before the second output of the first counter circuit, so that if a function signal is signalled, the pulse from the two-state device is transmitted when the third output is energised, and if a non-function signal is signalled, the pulse from the two-state device is transmitted when the fourth output is energised.

Preferably, the gating circuit includes a gate circuit having one input which is connected to the output of the two-state circuit and having another input connected to a fifth output of the first counter circuit which output is enregised after the second and third outputs so as to convert the pulse from the two-state circuit into the equivalent output pulse train.

Preferably, a coincidence circuit comprises a pair of switch means connected in series to an output at one end of a lead whose other end is connected to a source of voltage, a pair of switch means connected in parallel to one end of a lead whose other end is connected to the source of voltage, an invertor circuit whose input is connected to the pair of parallel switch means and whose output is connected to the one end of the lead connected to the pair of series switch means, the inputs of the series switch means and the parallel switch means being connected together respectively to form a pair of inputs for connection to the respective inputs under test for coincidence; whereby when the inputs signals to the coincidence circuit are at the same value, the output is at a signal value which energises the input of the AND gate, and when the input signals to the coincidence circuit are of different values, the output is at a signal value which does not energise the input of the AND gate.

The switching means are preferably metal-oxide silicon transistors which have a 'control'electrode and two 'contact' electrodes and which have the property that when a negative potential is applied to the control electrode a short circuit exists between the two contact electrodes and when a positive potential is applied to the control electrode an open circuit exists between the two contact electrodes. The switching transistors therefore simulate the action of a relay.

Preferably, the two-state circuit is a pair of two-input NOR gate circuits each of the gate circuits having the output thereof connected to an input of the other gate circuit. One of the gate circuits has the reset line from the second count circuit as the other input; and the other gate circuit has set line from the AND gate circuit as the other input.

Preferably the inputs of the converting circuit are connected to the outputs of an encoder in the form of a diode matrix whose inputs are connected to the keys of a keyboard. The keyboard connected to the encoder and converting circuit may be part of a calculating machine and includes keys representing the digits 0 to 9 and the arithmetic functions and signals representing programme steps which can be performed by the calculating machine.

Figure 1B:
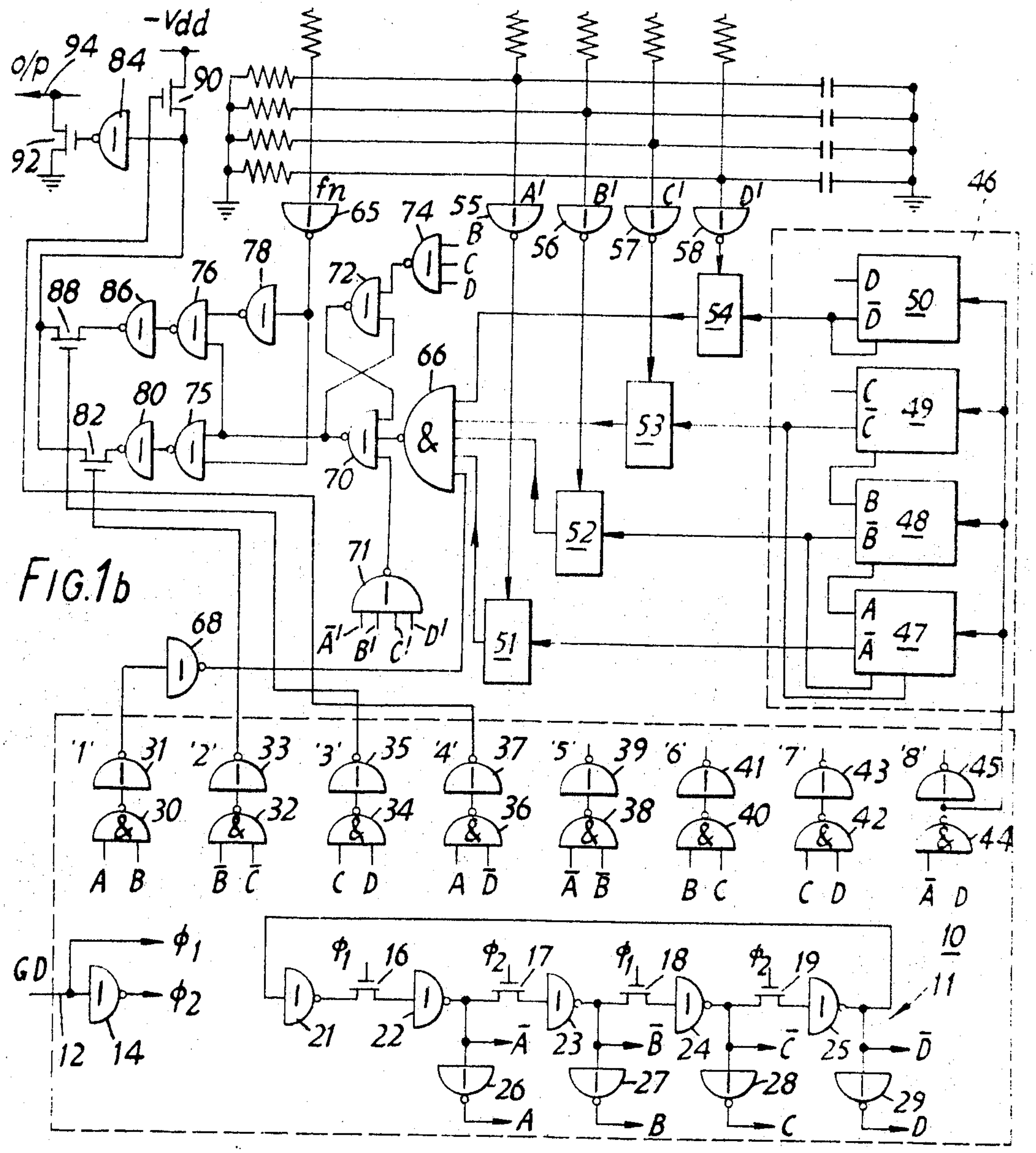
Figure 2:
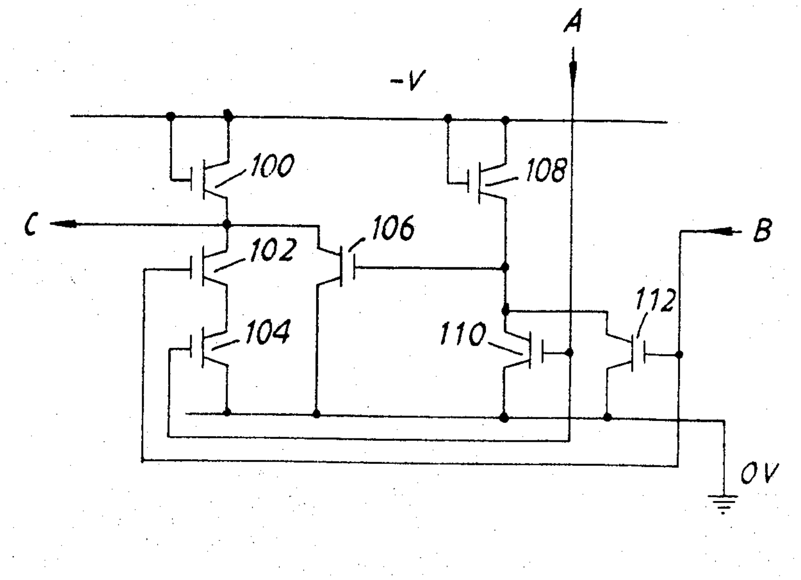
Figure 3:
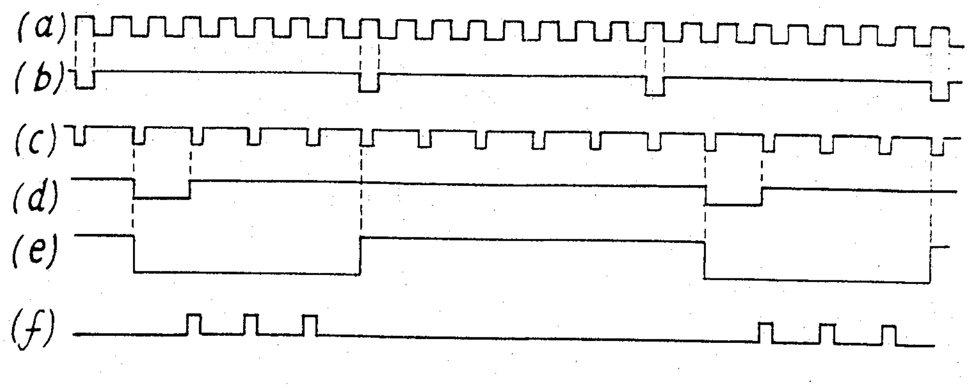

A constructional embodiment will now be described by way of example with reference to the accompanying drawings wherein:

FIG. 1,*a*,*b* shows a block schematic diagram of a circuit made according to the invention for converting a signal appearing in parallel and in code on at least two lines into a train of pulses in which the length of each of the pulses is proportional to the code of the coded signal;

FIG. 2 shows in greater detail one of the four coincidence circuits shown in Figure; and FIG. 3 shows voltage waveforms to a base of time occurring at various points on the circuit shown in FIG. 1.

The circuit shown in FIG. 1 includes a first counter circuit 10 which includes a closed-loop circuit 11 which is driven by oscillator pulses GD from an oscillator (not shown) and which has outputs which are connected to gate circuits. The first counter circuit 10 includes a plurality of nor gate circuits which for the inputs A and B give the outputs shown in the following Table 1:

TABLE 1

| A | B | C |
|---|---|---|
| 0 | 0 | 1 |
| 1 | 0 | 0 |
| 0 | 1 | 0 |
| 1 | 1 | 0 |

N.B. If the input is A only, the input B, which which is not connected, is equivalent to an input B=0 at all times, i.e. single-input NOR gate circuit acts as an invertor circuit, where 1=15V, 0=0V In the first counter circuit 10, the negative-going oscillator pulses GD are transmitted along the line 12 to give a direct output $\phi$1, and, through a 'NOR' gate circuit 14, an inverted output $\phi$2. The outputs $\phi$1 and $\phi$2 are applied to the 'control' electrodes of four metal oxide-silicon (MOS) switching transistors 16 to 19 whose 'conduction' electrodes are connected in series with five 'NOR' gate circuits 21 to 25 form the closed-loop circuit 11. The respective outputs of the four 'NOR' gate circuits 22 to 25 are connected to respective 'NOR' gate circuits 26 to 29 to give the outputs $\bar{A}$, A; $\bar{B}$, B; $\bar{C}$, C; $\bar{D}$, D; The MOS switching transistors 16 to 19 have the property that a negative voltage applied to a 'control' electrode causes the creation of a short-circuit between the conduction electrodes and vice versa.

Thus the sequential application of the outputs $\phi$1 and $\phi$2 to the closed-loop formed by the MOS switching transistors 16 to 19 and the 'NOR' gate circuits 21 to 25 causes the following truth table to Table 2 to be followed by the outputs of A,B,C and D. The output 'slot' and 'decode' will be explained later.

TABLE 2

| $\phi$1 | $\phi$2 | A | B | C | D | Slot | Decode | |
|---|---|---|---|---|---|---|---|---|
| 0 | 1 | 0 | 1 | 0 | 1 | 8 | $\bar{A}$ | D |
| 1 | 0 | 1 | 1 | 0 | 1 | 1 | A | B |
| 0 | 1 | 1 | 0 | 0 | 1 | 2 | $\bar{B}$ | $\bar{C}$ |
| 1 | 0 | 1 | 0 | 1 | 1 | 3 | C | $\bar{D}$ |
| 0 | 1 | 1 | 0 | 1 | 0 | 4 | A | D |
| 1 | 0 | 0 | 0 | 1 | 0 | 5 | $\bar{A}$ | $\bar{B}$ |
| 0 | 1 | 0 | 1 | 1 | 0 | 6 | B | C |
| 1 | 0 | 0 | 1 | 0 | 0 | 7 | $\bar{C}$ | $\bar{D}$ |
| 0 | 1 | 0 | 1 | 0 | 1 | 8 | $\bar{A}$ | D |

In the top line of the truth table if the MOS transistors 16 and 18 connected to the output $\phi$1 are in the open-circuit condition, the MOS transistors 17 and 19 connected to the output $\phi$ 2 are in the short-circuit condition. If the output D is equal to 1, then the output C is equal to 0. It is assumed that B is equal to 1, then C is equal to 1 as initial conditions. The successive operations of the outputs $\phi$1 and $\phi$2 cause the outputs A,B,C and D to follow the table shown and after eight changes return to the initial condition. These eight changes of output are repeated sequentially and are labelled slots '1' to '8' as shown. The 'decode' column in the table are the outputs of the 'NOR' gate circuits 22 to 29 which identify the 'slots' and these outputs are applied to the respective pairs of 'NAND' gate circuits 30 and 31, 32 and 33,34 and 35, 36 and 37,38 and 39,40 and 41,42 and 43,44 and 45 which are connected to the 'slot' output lines marked '1' to '8' respectively. The slot output lines '1,' '2,' '3,' '4,' and '8' are the second, third, fourth, fifth, and first output lines of the first counter circuit 10.

The inverted output of the first line '8' at the output of the 'NOR' gate circuit 44 is connected to the clock pulse inputs of a second counter circuit 46 which comprises four bistables circuits 47,48,49 and 50, which are interconnected to form a decade counter circuit. The outputs $\bar{A}$, $\bar{B}$, $\bar{C}$, and $\bar{D}$ of the four bistable circuits 47 to 50 respectively are connected as first inputs to the four coincidence circuits 51,52,53 and 54 respectively. The coincidence circuits 51 to 54 are shown as rectangles only in FIG. 1; but the internal connections of the coincidence circuit will be described later with respect to FIG. 2.

The coincidence circuits 51 to 54 have second inputs which are connected through 'NOR' gate circuits 55 to 58 respectively to the four output lines A,B,C and D of an encoder in the form of a diode matrix 60. The four encoder output lines A',B',C' and D' are connected 47 forward-biased diodes as shown in the FIG. 1 to the normally-open set of keys 62 which are labelled the digits '0' to '9', and the programme steps D.P and C.E. respectively and which are connected to a potential of −15 volts. The output lines A', B', C' and D' are connected to earth potential through respective capacitors and pairs of resistors forming potential dividers. The matrix 60 also has an output line *fn* which is connected through forward-biased diodes as shown in the FIG. 1 to a set of normally-open keys 64 which are labelled with the arithmetic functions '+,' '−,' '÷,' '−√' ' and 'ST' and the programme steps 'ME,' '%', and which are connected to a potential of −15 volts. The output line *fn* is connected through a resistor to the input of a 'NOR' gate circuit 65.

The outputs of the coincidence circuits 51 to 54 are connected respectively to four of the five inputs of a 'NAND' gate circuit 66; the fifth input is connected to the second output '1' of the first counter circuit 10 through a 'NOR' gate circuit 68. The 'NAND' gate circuit is such that the inputs A and B give the output C shown in the following Table 3, where logic '1' is negative and logic '0' is positive as before.

TABLE 3

| A | B | C |
|---|---|---|
| 0 | 0 | 1 |
| 0 | 1 | 1 |
| 1 | 0 | 1 |

The output of the 'NAND' gate CIRCUIT 66 is connected to an input of a three-input 'NOR' gate circuit 70. The output of the 'NOR' gate circuit 70 is connected to an input of a two-input 'NOR' gate circuit 72 whose output is connected to the second input of the 'NOR' gate circuit 70. A four-input 'NOR' gate circuit 71 whose respective inputs are connected to the output line $\overline{A}$,' which is the output of an invertor circuit (not shown) connected to the output line A', and the output lines B', C' and D' respectively has its output connected to the third input of the 'NOR' gate circuit 70. The second input of the 'NOR' gate 72 is 'reset' line which is connected to a three-input 'NOR' gate circuit 74 whose inputs are connected to the outputs B,C, and D of the bistable circuits 48, 49 and 50 respectively. The output of the 'NOR' gate circuit 70 is connected to an input of a pair of two-input 'NOR' gate circuits 75 and 76. The output of the 'NOR' gate circuit 65 is connected to the second input of the 'NOR' gate circuit 75 and is connected through the 'NOR' gate circuit 78 to the second input of the 'NOR' gate circuit 76. The output of the 'NOR' gate circuit 75 is connected to the input of a 'NOR' gate circuit 80 whose output is connected through the 'conduction' connections of a MOS switching transistor 82 to the input of a 'NOR' gate circuit 84. The 'control' connection of the switching transistor 82 is connected to the third output line '2' of the first counter circuit 10. Similarly, the output of the 'NOR' gate circuit 76 is connected to the input of a 'NOR' gate circuit 86 whose output is connected through the 'conduction' connections of a MOS switching transistor 88 to the input of the 'NOR' gate circuit 84. The 'control' connection of the switching transistor 88 is connected to the fourth output line '3' of the first counter circuit 10.

The input of the 'NOR' gate circuit 84 is connected through the 'conduction' electrodes of a MOS switching transistor 90 to a voltage - Vdd. The 'control' electrode of the switching transistor 90 is connected to the fifth output line '4' of the first counter circuit 10. The output of the 'NOR' gate circuit 84 is connected to the 'control' connection of a MOS switching transistor 92 whose 'conduction' connections are connected to earth potential and to the signal output line 94 respectively.

One of the coincidence circuits shown as a rectangle 51,52,53 or 54 in FIG. 1 is shown in detail in FIG. 2. The coincidence circuit circuit comprises MOS switching transistors inter-connected to form a logic network. The conduction electrodes of the three switching transistors 100, 102 and 104 are connected in series and connected between a negative potential −V and earth potential. The conduction electrodes of a switching transistor 106 are connected in parallel with the conduction electrodes of the switching transistors 102 and 104. Similarly, the conduction electrodes of the MOS switching transistors 108 and 110 are connected in series and connected between the negative potential −V and earth potential, and the conduction electrodes of a switching transistor 112 are connected in parallel with the conduction electrodes of the switching transistor 110. The control electrodes of the switching transistors 100 and 108 are connected to the negative potential −V so that these transistors conduct and act as loads. The control electrode of the switching transistor 106 is connected to the junction of the conduction electrodes of the switching transistors 108 and 110. The control electrodes of the switching transistors 104 and 110 are connected to an input A; the control electrodes of the switching transistors 102 and 112 are connected to an input B. The junction between conduction electrodes of the switching transistors 100 and 102 is connected to an output C. As previously described, there is a short-circuit condition between conduction electrodes when a negative voltage is applied to the control electrode of a switching transistor and there is an open-circuit when a positive voltage is applied to the control electrode.

In operation, the coincidence circuit has the truth table as shown in Table 4 where 1 is negative logic and 0 is positive logic.

TABLE 4

| A | B | C |
|---|---|---|
| 1 | 1 | 0 |
| 0 | 1 | 1 |
| 1 | 0 | 1 |
| 0 | 0 | 0 |

It is apparent from Table 4 that coincidence in the two input signals causes generation of the output signal 0.

The circuit shown in FIG. 1 operates as follows:

As previously described, the oscillator pulses GD shown in FIG. 3(*a*), cause the output lines '1' to '8' of the first counter circuit 10 to be energised in cyclic sequence. The pulses on the slot output line '8' which is the first output line of the first counter circuit 10 are shown in FIG. 3(*b*) on the same time scale as the oscillator pulses GD in FIG. 3(*a*) and are shown also in FIG. 3(*c*) on a time scale which is reduced with respect to FIG. 3(*b*).

The pulses are transmitted along slot output line '8' of the first counter circuit 10 to the second counter circuit and sequentially and cyclically signalled signals are transmitted to one or more coincidence circuits 51,52,53 and 54 by the outputs $\overline{A}$, $\overline{B}$,$\overline{C}$ and $\overline{D}$ respectively of the second counter circuit 46. The reference count state signal of each of the cycles of count state signals from the second counter circuit is taken as the signal where the outputs B,C and D are energised simultaneously and this count state signal energises the 'NOR' gate circuit 74 to emit a 'reset' pulse which is shown in FIG. 3(*d*). The count state signals, other than the reference count state signal, of the second counter circuit 46 are connected as the inputs B of the circuits of the coincidence circuits 51 to 54 (shown in FIG. 2.).

When a key other than the key representing the digit 0 on the set of keys 62 is depressed, a negative-going signal is generated on at least one of the lines A',B',C', or D', which negative-going signal corresponds to one of the count state signals other than the reference count state signal. When the key representing the digit 0 on the set of keys 62 is depressed, a signal appears simultaneously on the lines A',B',C' and D' and also on the inputs to the NOR gate circuit 74. When a key representing a function on the set of keys 64 is depressed, a signal simultaneously appears on the output line fn and on at least one of the output lines A',B',C' or D'. The signal appearing on at least one of the output lines A',B',C',or D' when a key on the set of keys 64 is depressed corresponds to the signal of the key on the set of keys 62 which is connected to the same isolating diode between the sets of keys 62 and 64.

Any signals appearing on the output lines A',B',C' or D' form the input A of the coincidence circuits 51 to 54 shown in FIG. 2. The outputs of the coincidence circuits 51 to 54, when a signal on the line A',B',C' or D' coincides with the count state signal from the second counter 46, are applied to the inputs of the NAND gate circuit 66. When the slot output line '1' or the first counter circuit 10 is energised, which occurs immediately after the slot output line '8' which changes the count state of the second counter circuit 46 to the 'coincidence' count state, the output of the NAND gate circuit 66 is energised to transmit a set pulse to the pair of cross-coupled NOR gate circuits 70 and 72, which changes the output of the NOR gate circuit 70. As shown in FIG. 3(*e*), the output of the NOR gate circuit 70 is sent to a negative potential by the leading edge of the reset pulse from the output of the NOR gate circuit 74 and is sent to a positive potential by the leading edge of the set pulse from the NAND gate circuit 66. The length of the negative-going pulse is proportional to the position of the coincidence count state with respect to the 'reference' count pulse of the second counter circuit 46. When the key representing the digit 0 is depressed, the leading edge of the reset pulse from the NOR gate circuit 74 sends the output of the NOR gate circuit 70 to a negative potential and the leading edge of the step pulse from the NOR gate circuit 71 sends the output of the NOR gate circuit 70 back to a positive potential so that the length of the negative-going output pulse is equal to the length of the reset pulse. Thus, as shown in FIG. 3(*e*) for the digit key 3 on the set of keys 62, when any of the keys on the set of keys 62 or 63 is depressed, a train of cyclically-repeated pulses with a negative-going pulse length depending on the key depressed appears at the output of the NOR gate circuit 70.

The pulses from the output of the NOR gate circuit 70 are applied to an input of each of the NOR gate circuits 75 and 76; the other input of these NOR gate circuits are connected to the matrix output line fn which goes to a negative potential when a key on the set of keys 64 is depressed. The effect of the matrix output line fn is that, when a key on the set of keys 62 is depressed, the resulting train of pulses appear at the output of the NOR gate circuit 86; and when a key on the set of keys 64 is depressed, the resulting train of pulses appear at the output of the NOR gate circuit 80. Thus, the outputs of the NOR gate circuit 80 or 86 are at a negative potential for a time period which is a multiple of the time between one of the slot output line '1' and the next energisation of the slot output line '1'. Since the energisation of the slot output lines '2' and '3' and '4' are in fixed time relations with the energisation of the slot output lines '1', the number of times there slot output lines are at a negative potential is proportional to the number of times the slot output line '1' is at a negative potential for a particular key signal. Hence, a train of pulses of number equal to the number of times the slot output line '1' is at a negative potential are transmitted to the input of the NOR gate circuit 84 either by energisation of the output lines '2' of the first counter circuit 10, when a key of the set of keys 64 is depressed, or by energisation of the output line '3' of the first counter circuit 10, when a key of the set of keys 62 is depressed. The train of negative-going pulses at the input of the NOR gate circuit 84 cause the switching transistor 92 to apply the earth potential to the output line 94, which is normally at a negative potential, when the input of the NOR gate circuit 84 is at a positive potential, so as to convert the input train of negative-going pulses into a train of positive-going pulses on the output line 94 as shown in FIG. 3(*f*) for the digit key 3 on the set of keys 62. The train of negative-going pulses at the input of NOR gate circuit 84 (and the train of positive-going pulses at the output line 94 as shown in FIG. 3(*f*)) is repeated at a time interval equal to the time interval between one reset pulse and the next reset pulse, while the key on the set of keys 62 or 64 remains depressed. The slot output line '4' causes the switching transistor 90 to apply the negative voltage −vdd to the input of the NOR gate circuit 84, so that the switching transistor 92 is in the open-circuit condition to isolate the output line 94 from any earlier signals which remain at the input of the NOR gate circuit 84.

What we claim is:

1. A circuit for converting signal codes appearing on at least two circuit inputs into an output pulse train with a duration identifying the signal codes, comprising in combination a reset circuit for generating in cyclic sequence a set of successive reset pulses, a coding circuit providing a succession of signals which correspond to the code signals on said circuit inputs, a comparison circuit for comparing the code signal on the circuit inputs with the successive reset pulses generated by the reset circuit so as to emit a set pulse when the code signals and one of the reset signals in the set coincide, a two-state flip-flop circuit having an output operable by said set signal and by one of said reset pulses to emit an identifying pulse whose length identifies one of the code signals on said circuit inputs, a pulse train source, and a gating circuit connected for receiving and converting the emitted pulse from the two-state circuit and the pulse train from said source into an output pulse train having different durations for different signal codes.

2. A circuit according to claim 1 wherein the reset generating circuit includes a source of count plses, a first closed-loop counter circuit having an input connected to said source of count pulses and having a first output and a second output, a second closed-loop counter circuit having an input thereof connected to a first output of the first counter circuit and having at least two outputs and said gating circuit including means connected to said two outputs of the second counter circuit to generate in cyclic sequence the reset pulse and the succession of code signals.

3. A circuit according to claim 2 including an AND gate circuit whose output is connected to the reset input of the two-state circuit and whose inputs are connected to outputs of the second counter circuit so that a reset pulse is generated once during every cycle of count states of the second counter circuit.

4. A circuit according to claim 3 wherein the comparing circuit includes at least two coincidence circuits each having two inputs, each coincidence circuit having one input connected to an input of the converting circuit respectively and having the other input connected to an output of the second counter circuit respectively, and an AND gate circuit having inputs connected to the outputs of the coincidence circuits respectively and having the output thereof connected to the set input of the two-state circuit and having an input of the AND gate circuit connected to the second output of the first counter circuit; whereby, when a signal code appears on the inputs of the converting circuit and when the source of pulses supplies pulses to pulse in sequence the first and second outputs of the first counter circuit, the successive pulses on the first output supply pulses to the second counter circuit to pulse the outputs thereof in successive cyclic sequence so as to transmit along the respective other inputs to the coincidence circuits the sequence of successive code signals with the successive pulses on the second output of the first counter circuit supplying pulses to the AND gate circuit between successive code signals of the sequence of code signals; and whereby, when the coded signals appear in coincidence on the respective one and other inputs of the coincidence circuits, the output of the two-state circuit is changed by a set pulse from the AND gate circuit and the two-state circuit is changed by a reset pulse from the AND gate circuit so as to generate a pulse whose length is proportional to the code of the code signal.

5. A circuit according to claim 2 wherein the circuit includes a function decoder circuit having a line which is energized when a function signal is signalled, an invertor circuit connected to the function line, a pair of two-input gate circuits having one input of each gate circuit connected to the function line and invertor output respectively and having the other inputs connected to the output of the two-state circuit, a pair of switching means whose inputs are connected to the outputs of the pair of gate circuits respectively and whose outputs are connected to a common output line, additional third and fourth outputs for said first counter circuit which third and fourth outputs are energized after the first outputs are energized but before the second output of the first counter circuit, and control connections of the switch means connected to the third and fourth outputs respectively of the first counter circuit, so that if a function signal is signalled, the pulse from the two-state device is transmitted when the third output is energized and if a non-function signal is signalled, the pulse from the two-state device is transmitted when the fourth output is energized.

6. A circuit according to claim 5 having a fifth output of the first counter circuit energized after the second and third outputs wherein the gating circuit includes a gate circuit having one input connected to the output of the two-state circuit and having another input connected to a fifth output of the first counter circuit so as to convert the pulse from the two-state circuit into the equivalent output pulse train.

7. A circuit according to claim 4 wherein one coincidence circuit comprises a pair of switch means connected in series to provide an output, a further pair of switch means connected in parallel to produce a common output, and an invertor circuit with an input connected to the output of the pair of parallel switch means and with an output connected to one of the pair of switch means connected in series.

8. A circuit according to claim 7 wherein the switching means are metal-oxide silicon transistors which have a control electrode and two contact electrodes and which have the property that when a negative potential is applied to the control electrode a short circuit exists between the two contact electrodes and when a positive potential is applied to the control electrode an open circuit exists between the two contact electrodes.

9. A circuit according to claim 3 wherein the two-state circuit comprises a pair of two-input NOR gate circuits each having the output thereof connected to one input of the other, one having the reset line from the second count circuit as the other input, and the other having the set line from the AND circuit as the other input.

10. A circuit according to claim 1 including a keyboard with a plurality of keys and a diode matrix encoder connected to the keys thereof, wherein inputs of the circuit converting the emitted pulse are connected to the outputs of the matrix encoder.

* * * * *